United States Patent
Chan et al.

(10) Patent No.: US 8,618,617 B2
(45) Date of Patent: Dec. 31, 2013

(54) FIELD EFFECT TRANSISTOR DEVICE

(71) Applicants: International Business Machines Corporation, Armonk, NY (US); GlobalFoundries, Inc., Grand Cayman, KY (US)

(72) Inventors: Kevin K. Chan, Staten Island, NY (US); Abhishek Dube, Fishkill, NY (US); Eric C. Harley, Lagrangeville, NY (US); Judson R. Holt, Wappingers Falls, NY (US); Viorel C. Ontalus, Danbury, CT (US); Kathryn T. Schonenberg, Wappingers Falls, NY (US); Matthew W. Stoker, Poughkeepsie, NY (US); Keith H. Tabakman, Fishkill, NY (US); Linda R. Black, Fishkill, NY (US)

(73) Assignees: International Business Machines Corporation, Armonk, NY (US); GlobalFoundries, Inc. (KY)

( * ) Notice: Subject to any disclaimer, the term of this patent is extended or adjusted under 35 U.S.C. 154(b) by 0 days.

(21) Appl. No.: 13/783,526

(22) Filed: Mar. 4, 2013

(65) Prior Publication Data

US 2013/0175547 A1    Jul. 11, 2013

Related U.S. Application Data

(62) Division of application No. 12/825,791, filed on Jun. 29, 2010, now Pat. No. 8,492,234.

(51) Int. Cl.
*H01L 27/088* (2006.01)

(52) U.S. Cl.
USPC ............ 257/401; 257/E21.091; 438/300; 438/222

(58) Field of Classification Search
USPC .................................. 257/190, 401
See application file for complete search history.

(56) References Cited

U.S. PATENT DOCUMENTS

| | | |
|---|---|---|
| 6,991,956 B2 | 1/2006 | Ghyselen et al. |
| 7,018,910 B2 | 3/2006 | Ghyselen et al. |
| 7,176,481 B2 | 2/2007 | Chen et al. |
| 7,309,660 B2 | 12/2007 | Chen |
| 7,361,563 B2 | 4/2008 | Shin et al. |
| 7,368,358 B2 | 5/2008 | Ouyang et al. |
| 7,396,714 B2 | 7/2008 | Chen et al. |
| 7,402,497 B2 | 7/2008 | Wei et al. |

(Continued)

OTHER PUBLICATIONS

Huang, Ru., et al. "Challenges of 22 nm an beyond CMOS technology" Science in China Series F: Information Sciences; vol. 52, No. 9, Sep. 2009. pp. 1491-1533.

(Continued)

*Primary Examiner* — David Vu
*Assistant Examiner* — Earl Taylor
(74) *Attorney, Agent, or Firm* — Cantor Colburn LLP; Yuanmin Cai (57) ABSTRACT

A method for forming a field effect transistor device includes forming a gate stack portion on a substrate, forming a spacer portion on the gates stack portion and a portion of the substrate, removing an exposed portion of the substrate, epitaxially growing a first silicon material on the exposed portion of the substrate, removing a portion of the epitaxially grown first silicon material to expose a second portion of the substrate, and epitaxially growing a second silicon material on the exposed second portion of the substrate and the first silicon material.

9 Claims, 6 Drawing Sheets

(56) References Cited

U.S. PATENT DOCUMENTS

| | | |
|---|---|---|
| 7,456,087 B2 | 11/2008 | Cheng |
| 7,479,432 B2 | 1/2009 | Murthy et al. |
| 7,525,161 B2 | 4/2009 | Ieong et al. |
| 7,572,712 B2 | 8/2009 | Chong et al. |
| 7,622,341 B2 | 11/2009 | Chudzik et al. |
| 7,824,993 B2 | 11/2010 | Holz et al. |
| 7,829,421 B2 | 11/2010 | Wei et al. |
| 7,875,521 B2 | 1/2011 | Shimamune et al. |
| 7,883,980 B2 | 2/2011 | Grupp et al. |
| 7,892,932 B2 | 2/2011 | Cheng et al. |
| 7,910,445 B2 | 3/2011 | Onoda |
| 7,943,469 B2 | 5/2011 | Cook, Jr. et al. |
| 7,964,910 B2 | 6/2011 | Dyer |
| 7,968,414 B2 | 6/2011 | Ohta et al. |
| 7,989,298 B1 | 8/2011 | Chan et al. |
| 7,989,901 B2 | 8/2011 | Lin et al. |
| 7,994,014 B2 | 8/2011 | Yang et al. |
| 8,017,487 B2 | 9/2011 | Chong et al. |
| 8,039,341 B2 | 10/2011 | Thean et al. |
| 8,043,919 B2 | 10/2011 | Chen et al. |
| 8,058,133 B2 | 11/2011 | Tsai et al. |
| 8,062,948 B2 | 11/2011 | Shin |
| 8,071,442 B2 | 12/2011 | Kronholz et al. |
| 8,138,050 B2 | 3/2012 | Papageorgiou et al. |
| 8,154,050 B2 | 4/2012 | Sudo |
| 8,183,100 B2 | 5/2012 | Mulfinger et al. |
| 8,207,033 B2 | 6/2012 | Kim et al. |
| 8,207,523 B2 | 6/2012 | Tsai et al. |
| 2004/0157409 A1 | 8/2004 | Ghyselen et al. |
| 2005/0191825 A1 | 9/2005 | Ghyselen et al. |
| 2007/0105331 A1* | 5/2007 | Murthy et al. ............ 438/341 |
| 2007/0254421 A1 | 11/2007 | Tsai et al. |
| 2008/0157091 A1 | 7/2008 | Shin et al. |
| 2008/0237741 A1 | 10/2008 | Ranade et al. |
| 2009/0039399 A1 | 2/2009 | Sudo |
| 2009/0124056 A1 | 5/2009 | Chen et al. |
| 2009/0140302 A1* | 6/2009 | Onoda ............ 257/288 |
| 2009/0242936 A1 | 10/2009 | Cheng et al. |
| 2010/0090289 A1* | 4/2010 | Yang et al. ............ 257/369 |
| 2011/0003450 A1 | 1/2011 | Lee et al. |
| 2011/0147828 A1 | 6/2011 | Murthy et al. |
| 2011/0183486 A1 | 7/2011 | Chan et al. |
| 2011/0254105 A1 | 10/2011 | Cheng et al. |
| 2011/0263092 A1 | 10/2011 | Cheng et al. |
| 2011/0298008 A1 | 12/2011 | Greene et al. |
| 2011/0312145 A1 | 12/2011 | Tsai et al. |
| 2011/0316046 A1 | 12/2011 | Chan et al. |

OTHER PUBLICATIONS

Kuppurao, Satheesh, et al., "Integrating Selective Epitaxy in Advanced Logic & Memory Devices", Appliaied Materials, Inc., 2008, 1 pg.

Lee, Minjoo L. et al., "Strained Si, SiGe, and Ge channels for high-mobility metal-oxide-semiconductor field-effect transistors", (c) 2005 American Institute of Physics, downloaded Feb. 11, 2010, see http://jap.aip.org/jp.copyright.jsp; Journal of Applied Physics, 97, 011101 (2005), pp. 97-011101-1-011101-27.

Mistry, K., et al., "Delaying Forever: Uniaxial Strained Silicon Transistors in a 90nm CMOS Technology", Sep. 2004 (c) 2004 IEEE; 2004 Symposium on VLSI Technology, Digest of Technical Papers, pp. 50-51.

Cheng et al., "SiGe-On-Insulator (SGOI): Substrate Preparation and MOSFET Fabrication for Electron Mobility Evaluation", 2001 IEEE International SOI Conference, Oct. 2001, pp. 13-14.

Johnson et al., "Selective Chemical Etching of Polycrystalline SiGe Alloys with Respect to Si and SiO2" Journal of Electronic Materials, vol. 21, No. 8, 1992, pp. 805-810.

Weiser et al., "Nanoscale patterning of Si/SiGe heterostructures by electron-beam lithography and wet-chemical etching" Semicond. Sci. Technol., vol. 15, No. 8, 2000, pp. 862-867.

* cited by examiner

FIG. 10

FIELD EFFECT TRANSISTOR DEVICE

CROSS-REFERENCE TO RELATED APPLICATION

This application is a divisional of U.S. patent application Ser. No. 12/825,791, filed Jun. 29, 2010, the disclosure of which is incorporated by reference herein in its entirety.

BACKGROUND

The present invention relates to field effect transistor (FET) devices, and more specifically, to methods for fabricating FET devices.

FET devices include source, drain, and channel regions. The source and drain regions include doped ions. The source and drain regions may be doped using ion implantation methods following the formation of the source and drain regions, or may be doped during the formation of the source and drain regions. Stress liner material may be formed proximal to the channel regions. The stress liner material often enhances the carrier mobility and performance of the FET devices.

BRIEF SUMMARY

According to one embodiment of the present invention, a method for forming a field effect transistor device includes forming a gate stack portion on a substrate, forming a spacer portion on the gates stack portion and a portion of the substrate, removing an exposed portion of the substrate, epitaxially growing a first silicon material on the exposed portion of the substrate, removing a portion of the epitaxially grown first silicon material to expose a second portion of the substrate, and epitaxially growing a second silicon material on the exposed second portion of the substrate and the first silicon material.

According to another embodiment of the present invention, a field effect transistor device includes a gate stack portion disposed on a substrate, a first cavity region in the substrate arranged on a first side of the gate stack portion, a second cavity region in the substrate arranged on a second side of the gate stack portion, a first epitaxially grown silicon material disposed in the first cavity region and the second cavity region, and a second epitaxially grown silicon material disposed in the first cavity region and the second cavity region, the second epitaxially grown silicon material in contact with the first epitaxially grown silicon material.

According to yet another embodiment of the present invention, a field effect transistor device includes a first gate stack portion disposed on a substrate, a second gate stack portion disposed on the substrate, a cavity region in the substrate arranged between the first gate stack portion and the second gate stack portion, a first stressor portion disposed in the cavity region adjacent to a channel region of the first gate stack portion, a second stressor portion disposed in the cavity region adjacent to a channel region of the second gate stack portion, and a doped material disposed in the cavity region on the substrate, the first stressor portion and the second stressor portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
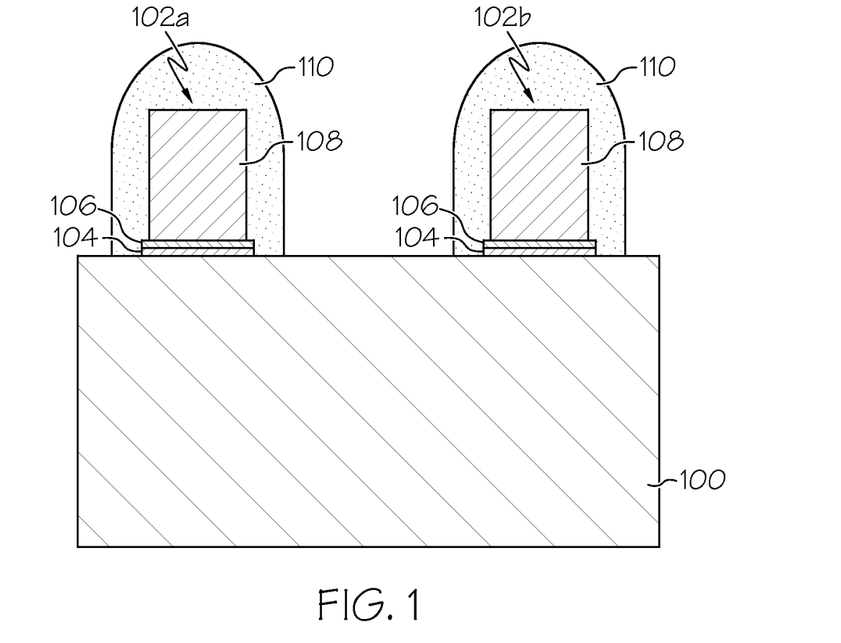
FIGS. 1-7 illustrate side views of a method for forming field effect transistor (FET) devices and the resultant structure of the devices.

FIGS. 1-7 illustrate side view of a method for forming field effect transistor (FET) devices and the resultant structure of the devices. Referring to FIG. 1, gate stacks 102a and 102b, referred to collectively as gate stacks (gate stack portions) 102 hereinafter, are formed on a silicon on insulator (SOI) substrate 100. The gate stacks 102 may include, for example, a dielectric layer 104 such as a high-K layer or oxide layer and a metal layer 106 disposed on the dielectric layer 104. A silicon capping layer 108 is disposed on the metal layer 106. A spacer (spacer portion) 110 is patterned over the gate stacks 102 and a portion of the substrate 100. The spacer 110 may include, for example, a nitride or oxide material. In the illustrated embodiment, the spacer 110 also includes a hardmask portion over the gate stacks 102.

Figure 2:
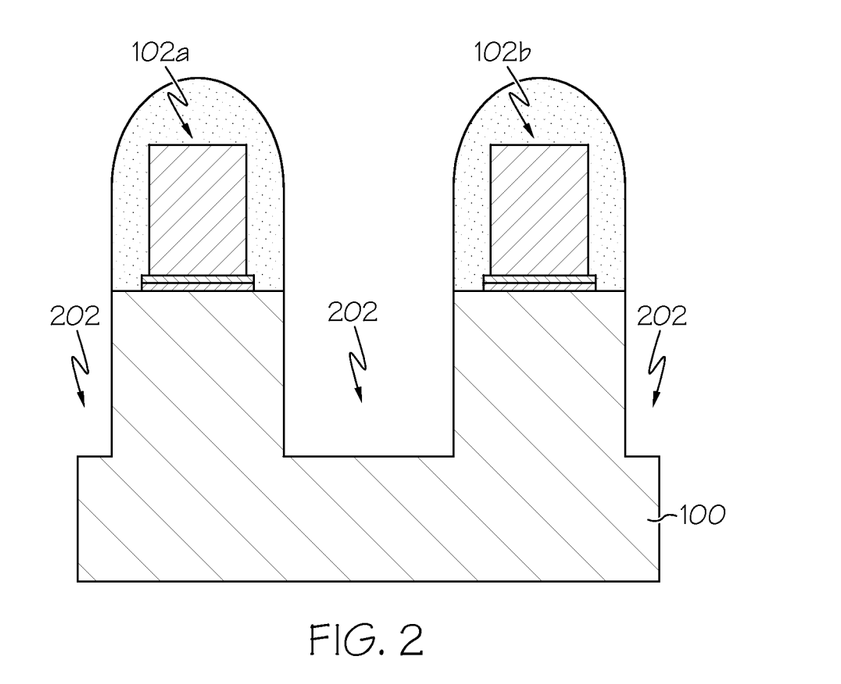

FIG. 2 illustrates the resultant structure following an anisotropic etching process such as, for example, reactive ion etching (RIE) that forms a trench (cavity region) 202 in the substrate 100 between the gate stacks 102a and 102b. Once the trench 202 is formed, the gate stacks 102 that will become n-type (NFET) devices, for example gate stack 102a, may be isolated by patterning a layer of nitride (not shown) over the gate stacks 102, leaving the gate stacks 102 that will become p-type (PFET) devices exposed.

Figure 3:
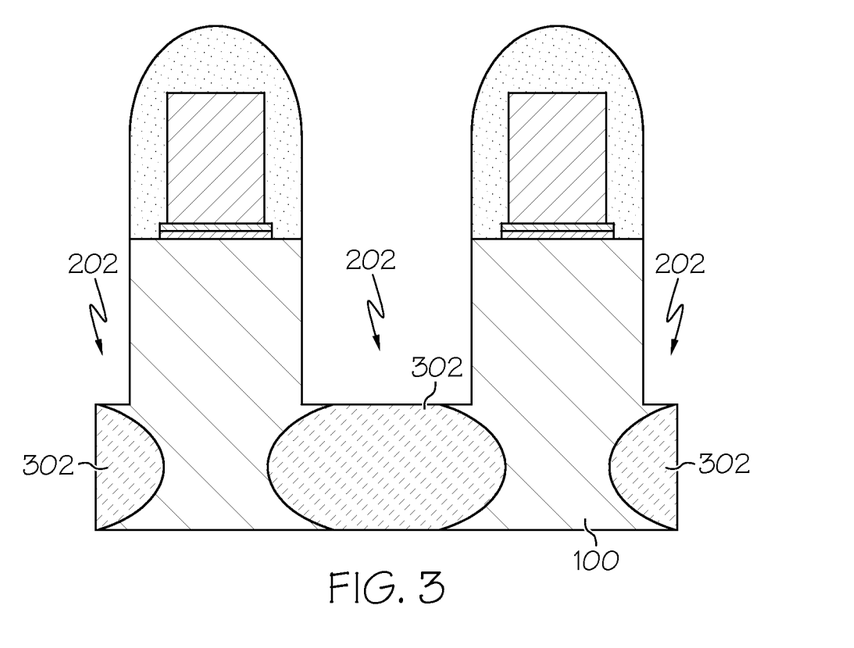

FIG. 3 illustrates regions 302 that may be formed by implanting ions, such as, for example, boron ions, in the substrate 100. In the illustrated embodiment, the regions 302 facilitate isolating adjacent devices such as devices to be formed by gate stacks 102a and 102b. The regions 302 are formed in the substrate 100 below the channels 202, however, in some embodiments, the sidewalls of the channels 202 may also be implanted with ions using, for example, an angled implant process. In alternate embodiments, the regions 302 may not be formed with ion implantation.

Figure 4:
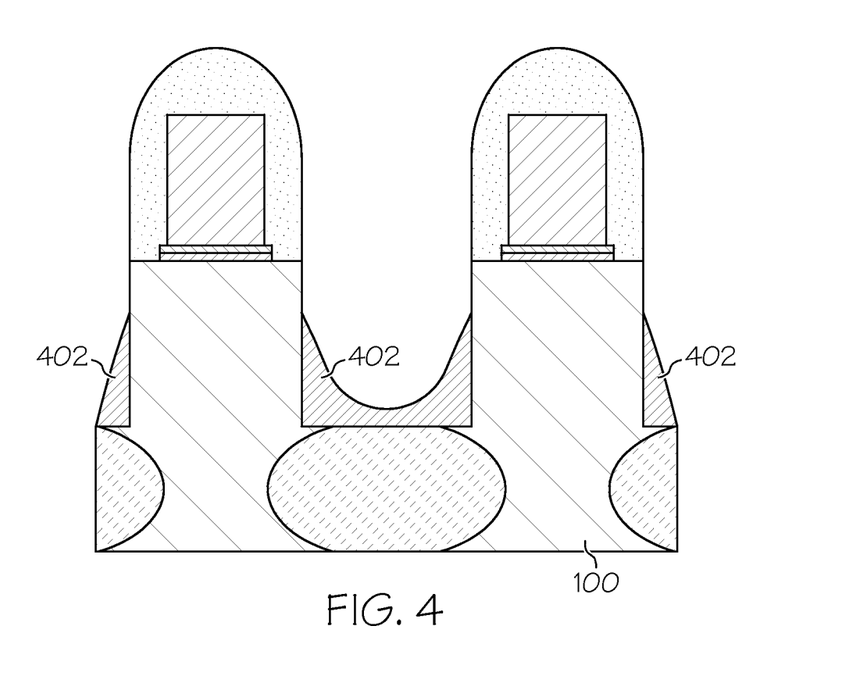

FIG. 4 illustrates the resultant structure following the epitaxial growth of a silicon-containing material (epi-silicon) 402 on the exposed portions of the substrate 100. In the illustrated embodiment, the epi-silicon 402 may include, for example, SiGe with greater than 30% (by atomic percentage) Ge content. Alternate embodiments may include between 20-50% Ge content. The epi-silicon 402 material may be undoped, low doped, or counter doped (e.g., doping an n-type region with p-type dopants or doping a p-type region with n-type dopants). In alternate exemplary embodiments, the epi-silicon material 402 may include, for example, SiC or other compound that may be used to form NFET devices. The formation of epi-silicon 402 SiC material includes multiple cycles of epitaxial SiC growth and etching to form the material 402. The carbon (C) content in the epi-silicon SiC may range from approximately 1% to 5%. The epi-silicon SiC may be undoped, low doped (i.e., doped with phosphorous or arsenic) or counter doped.

Figure 5:
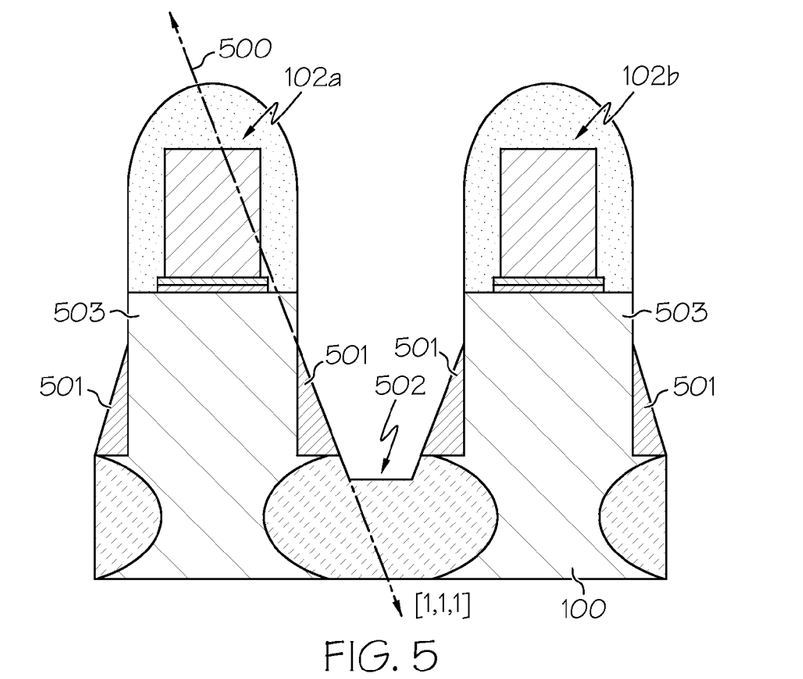

FIG. 5 illustrates the resultant structure following an etching process that removes portions of the epi-silicon material 402. The etching process may include, for example, a hydrogen chlorine (HCl) etch preformed in the epitaxy chamber, or other etching processes such as NH$_4$OH or Tetramethylammonium Hydroxide (TMAH) wet etching processes. The etching process etches the epi-silicon material 402 at a faster rate than the silicon substrate 100. The crystalline structure of the epi-silicon material 402 and the etching process results in the formation of stress regions 501 partially defined by a plane 500 arranged [1,1,1] (using Miller index notation). The stress regions 501 are adjacent to the channel regions 503 of the devices. The etching process exposes a portion of the substrate 100 in the region 502, between the devices.

Figure 6:
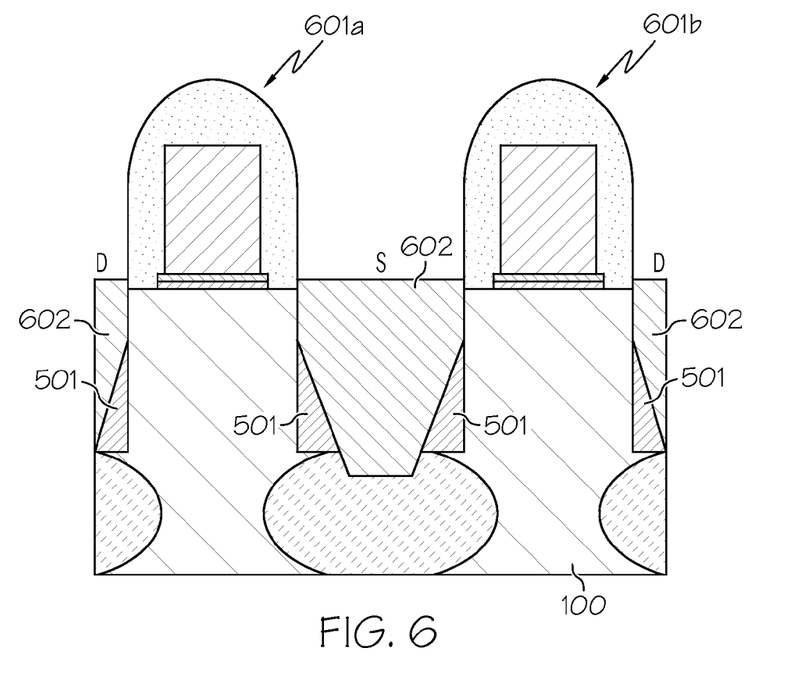

FIG. 6 illustrates the resultant structure following the epitaxial growth of doped silicon material 602 that forms the source regions (S) and drain regions (D) of devices 601a and 601b, hereinafter devices 601. In the illustrated embodiment, the doped silicon material 602 includes a doped SiGe material that is epitaxially grown from the exposed substrate 100 and the stress regions 501. The dopant may include, for example boron, arsenic, or phosphorous ions.

Figure 7:
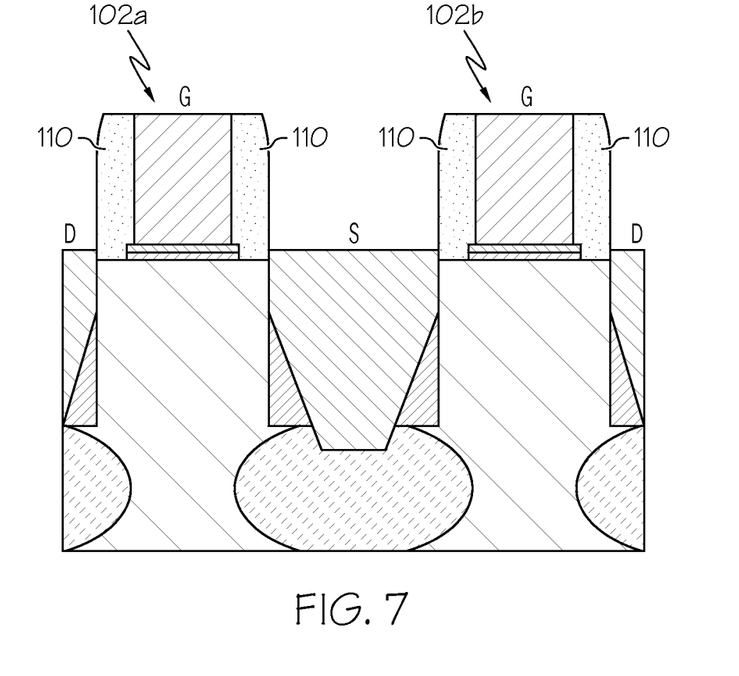

FIG. 7 illustrates the resultant structure following the removal of a portion of the spacer 110 that exposes the gate stacks 102a and 102b and defines gate regions (G) of the gate stacks 102. The portion of the spacer material 110 may be removed by, for example, a chemical mechanical polishing process, or a suitable etching process. Once the gate regions (G) have been exposed, a silicide may be formed on the exposed source, gate, and drain regions, and conductive contact material may be formed on the regions (not shown).

Figure 8:
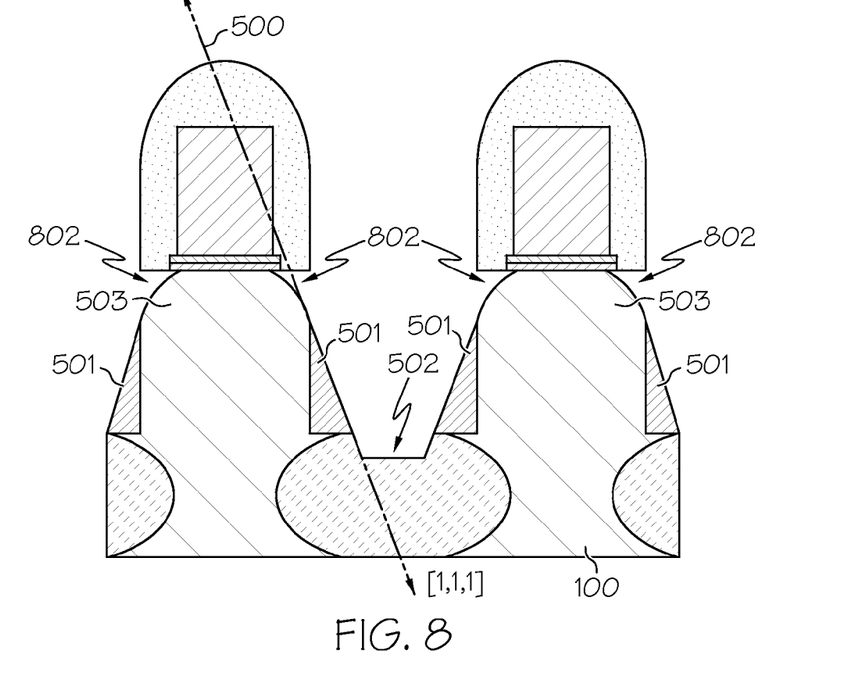
FIGS. 8-10 illustrate side views of an alternate method for forming field effect transistor devices and the resultant structure of the devices.

In an alternate embodiment, a similar etching process described above in FIG. 5 may remove portions of the epi-silicon material 402 and the SOI substrate 100. The etching process may include etchant parameters such as etchant chemicals that selectively etch both the epi-silicon material 402 and the silicon substrate 100 material. FIG. 8 illustrates the resulting structure following the removal of portions of the epi-silicon material 402 and the SOI substrate 100 that results in the formation of undercut regions 802. The undercut regions 802 may expose a portion of the gate stacks 102.

Figure 9:
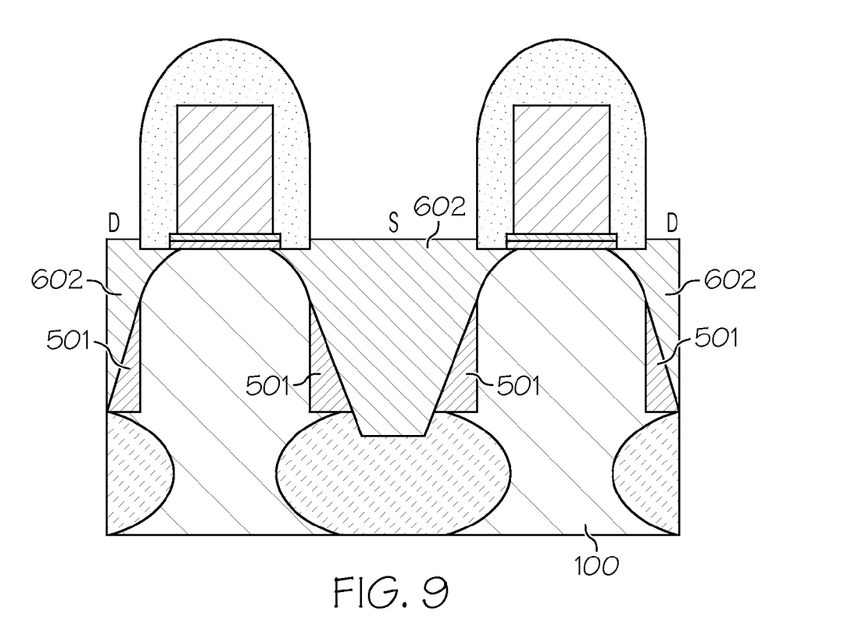

FIG. 9 illustrates the resultant structure following the epitaxial growth of doped silicon material 602 that is similar to the process described above in FIG. 6.

Figure 10:
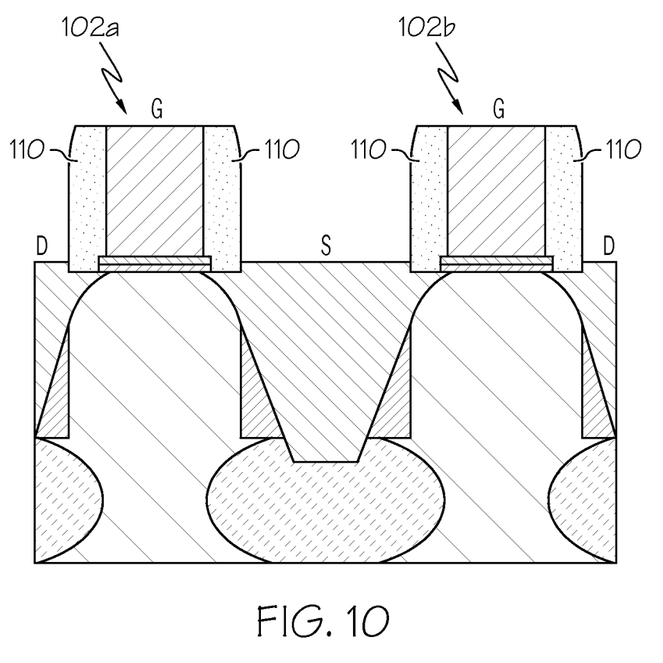

FIG. 10 illustrates the resultant structure following the removal of a portion of the spacer 110 that is similar to the process described above in FIG. 7.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
   a gate stack portion disposed on a substrate;
   a first cavity region in the substrate arranged on a first side of the gate stack portion;
   a second cavity region in the substrate arranged on a second side of the gate stack portion;
   a first epitaxially grown silicon material disposed in the first cavity region and the second cavity region, the first epitaxially grown silicon material including a void that exposes a portion of the substrate and defines two stress regions, the two stress regions being separated from one another by a second epitaxially grown silicon material different from the first epitaxially grown material;
   wherein the two separate stress regions are formed at opposing sides of the void; and
   the second epitaxially grown silicon material is disposed in the first cavity region and the second cavity region, the second epitaxially grown silicon material in contact with the first epitaxially grown silicon material.

2. The device of claim 1, wherein the first epitaxially grown silicon material defines a planar surface on the first silicon material orientated along a [1,1,1] Miller index axis of the first silicon material.

3. The device of claim 1, wherein the first side of the gate stack portion opposes the second side of the gate stack portion.

4. The device of claim 1, wherein the first epitaxially grown silicon material includes a stress portion defined by the substrate, a channel region of the device, and a planar surface on the first silicon material orientated along a [1,1,1] Miller index axis of the first silicon material.

5. The device of claim 1, wherein the second epitaxially grown silicon material is a doped SiGe material.

6. The device of claim 1, wherein the first epitaxially grown silicon material is a SiGe material including at least 20% by atomic percentage of Ge.

7. The device of claim 1, wherein the first epitaxially grown silicon material is a SiC material.

8. A field effect transistor device comprising:
   a first gate stack portion disposed on a substrate;
   a second gate stack portion disposed on the substrate;
   a cavity region in the substrate arranged between the first gate stack portion and the second gate stack portion;

a first epitaxially grown silicon material disposed in the cavity region, the first epitaxially grown silicon material including a void that exposes a portion of the substrate;

a first stressor portion disposed in the cavity region adjacent to a channel region of the first gate stack portion;

a second stressor portion disposed in the cavity region adjacent to a channel region of the second gate stack portion;

wherein the first and second stressor portions are formed at opposing sides of the void; and a doped material disposed in the cavity region on the substrate, the first stressor portion and the second stressor portion, the doped material separating the first stressor portion from the second stressor portion.

9. The device of claim 8, wherein the first and second stressor portions include an epitaxially grown silicon material.

* * * * *